(12) United States Patent
Dauelsberg et al.

(10) Patent No.: US 8,152,924 B2
(45) Date of Patent: Apr. 10, 2012

(54) CVD REACTOR COMPRISING A GAS INLET MEMBER

(75) Inventors: Martin Dauelsberg, Aachen (DE); Johannes Käppeler, Würselen (DE); Conor Martin, Sydney (AU)

(73) Assignee: Aixtron Inc., Sunnyvale, CA (US)

( * ) Notice: Subject to any disclaimer, the term of this patent is extended or adjusted under 35 U.S.C. 154(b) by 972 days.

(21) Appl. No.: 12/094,972

(22) PCT Filed: Nov. 11, 2006

(86) PCT No.: PCT/EP2006/068716
§ 371 (c)(1),
(2), (4) Date: May 23, 2008

(87) PCT Pub. No.: WO2007/060161
PCT Pub. Date: May 31, 2007

(65) Prior Publication Data
US 2008/0308040 A1    Dec. 18, 2008

(30) Foreign Application Priority Data
Nov. 25, 2005   (DE) .......................... 10 2005 056 320

(51) Int. Cl.
| | |
|---|---|
| *C23C 16/455* | (2006.01) |
| *C23C 16/458* | (2006.01) |
| *C23F 16/00* | (2006.01) |
| *H01L 21/306* | (2006.01) |
| *C23C 16/06* | (2006.01) |
| *C23C 16/22* | (2006.01) |

(52) U.S. Cl. ............. 118/715; 156/345.33; 156/345.34; 156/345.51; 156/345.54; 156/345.55; 118/729; 118/730

(58) Field of Classification Search .................. 118/715, 118/729, 730; 156/345.33, 345.34, 345.51, 156/345.54, 345.55
See application file for complete search history.

(56) References Cited

U.S. PATENT DOCUMENTS
3,783,822 A * 1/1974 Wollam ........................ 118/725
(Continued)

FOREIGN PATENT DOCUMENTS
DE    100 57 134 A1    5/2002
(Continued)

OTHER PUBLICATIONS
Aixtron AG, PCT/EP2006/068716, filed Nov. 22, 2006, International Search Report and Written Opinion, ISA/EP, Feb. 21, 2007, 10pp.

*Primary Examiner* — Rudy Zervigon
(74) *Attorney, Agent, or Firm* — SNR Denton US LLP

(57) ABSTRACT

The invention relates to a device for depositing at least one layer on a substrate by means of a process gas which is introduced through a flow channel (4), extending in a vertical direction, of a gas inlet member (3), fixed in place with respect to a reactor housing, into a process chamber (1), extending in a horizontal direction, wherein the process gas leaves a gas outlet opening of a portion of the gas inlet member (3), protruding into the center of the rotationally symmetrical process chamber (1), and flows in a radially outward direction via a base (8') of the process chamber (1), extending in a horizontal direction and rotating about the center, on which base the substrate lies. In order to improve the gas flow directly above the base of the process chamber, it is proposed that the front (3') of the gas inlet member (3) protrudes into a pot-like recess (23) and an end portion (6') of a gas deflecting face (6) is flush with the base (8').

11 Claims, 3 Drawing Sheets

U.S. PATENT DOCUMENTS

Figure 1:
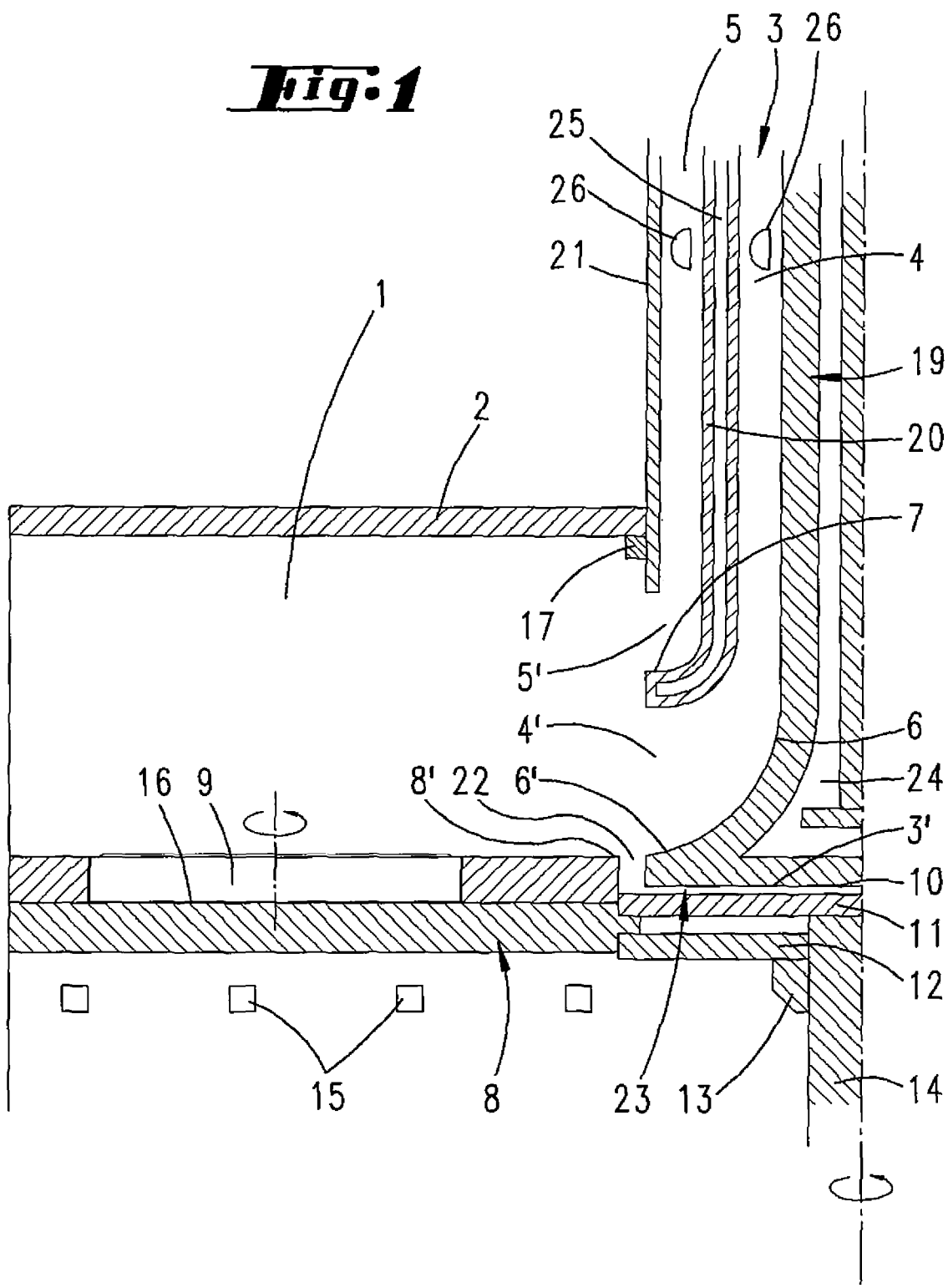

| | | | |
|---|---|---|---|
| 4,421,786 A * | 12/1983 | Mahajan et al. | 117/101 |
| 4,976,996 A | 12/1990 | Monkowski | |
| 5,221,556 A | 6/1993 | Hawkins | |
| 5,244,694 A | 9/1993 | Ozias | |
| 5,782,979 A * | 7/1998 | Kaneno et al. | 118/500 |
| 5,819,684 A | 10/1998 | Hawkins et al. | |
| 7,294,207 B2 * | 11/2007 | Strauch et al. | 118/715 |
| 2002/0168466 A1 * | 11/2002 | Tapphorn et al. | 427/180 |
| 2002/0179586 A1 | 12/2002 | Wengert | |
| 2003/0177977 A1 * | 9/2003 | Strauch et al. | 117/84 |
| 2003/0180460 A1 * | 9/2003 | Strauch et al. | 427/248.1 |
| 2004/0231599 A1 * | 11/2004 | Schwambera et al. | 118/728 |
| 2005/0011435 A1 * | 1/2005 | Dauelsberg | 117/92 |
| 2005/0153069 A1 * | 7/2005 | Tapphorn et al. | 427/180 |

FOREIGN PATENT DOCUMENTS

| | | |
|---|---|---|
| DE | 101 33 914 | 1/2003 |
| DE | 101 53 463 | 5/2003 |
| JP | 2004200225 | 7/2004 |
| JP | 2005072314 | 3/2005 |
| WO | 02/24985 A | 3/2002 |

* cited by examiner

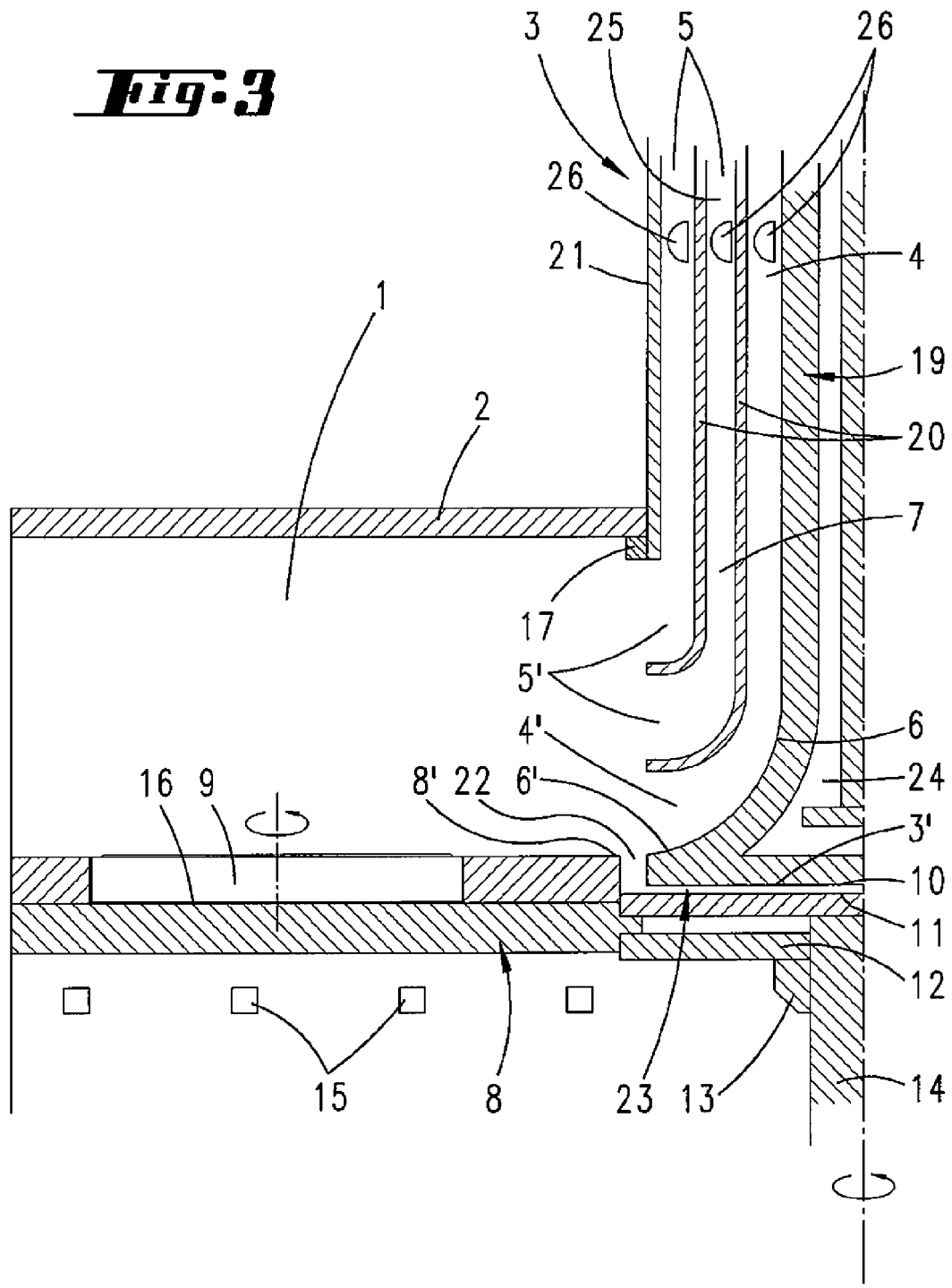

CVD REACTOR COMPRISING A GAS INLET MEMBER

CROSS REFERENCES TO RELATED APPLICATIONS

The present patent application is a National Stage under 35 USC 365 and claims priority to PCT International Application No. PCT/EP2006/068716 filed Nov. 21, 2006, incorporated herein by reference, which claims priority benefit from German Application No. 10 2005 056 320.1 filed Nov. 25, 2005.

The invention relates to an apparatus for depositing at least one layer on a substrate by means of a process gas, which is introduced into a process chamber that extends in a horizontal direction through a flow channel of a gas inlet element, the flow channel extending in a vertical direction and the gas inlet element being fixed in position on a reactor housing, the process gas exiting from a gas outlet opening of a portion of the gas inlet element that projects into the center of the rotationally symmetrical process chamber and flowing in a radially outward direction over a floor of the process chamber, the floor extending in a horizontal direction and rotating about the center of the process chamber, and the substrate lying on the floor.

The way in which the above-mentioned apparatus functions is described for example in DE 10057134 A1. This specification describes an MOCVD reactor comprising a rotationally symmetrical process chamber. Two or more process gases are fed into the process chamber, together with carrier gases, through a gas inlet element that is located in the center of the process chamber and along the axis of the chamber. Inflow of the process gases is effected in the axial direction, thus in the vertical direction. The gas inlet element then deflects the process gas into a horizontal direction. The two process gases flow in this direction over the floor of the process chamber, which is formed by a susceptor holder, the holder itself carrying a plurality of susceptors, each of which carries a substrate to be coated. In this specification, two outlet openings are provided, each for one process gas, and disposed one above the other in the vertical direction. A hydride is said to exit from the lower outlet opening and a metal-organic constituent from the upper outlet opening, in each case with a carrier gas. The outlet openings are located on a cylindrical lateral surface.

DE 10133914 A1 likewise describes an MOCVD reactor comprising a rotatable susceptor holder and a gas inlet element that is fixed in position, is located in the center of rotation, and from which the process gases exit. Here also, the hydride exits from a lower outlet opening. Here also, the lower wall of this outlet opening is formed by the floor of the process chamber.

DE 10153463 A1 describes an MOCVD reactor comprising a process chamber floor that is driven in rotation. A gas inlet element with an opening at its end, from which the hydride exits, is located above the floor and in the center of the process chamber. A second outlet opening is located directly underneath the top of the process chamber. The outlet opening has a cylindrical sleeve shape and is formed by a frit. A gas-deflecting surface having a curved surface is provided to the rear of the outlet opening.

A CVD reactor is known from U.S. Pat. No. 4,976,996 in which the process gases are introduced from the outside into a circular process chamber. This is effected through openings in the peripheral wall of the process chamber, the floor of which is formed by a substrate holder driven in rotation. Flow-guiding channels are provided at the radially outer edge of the substrate holder. Similar flow-guiding channels are at the center of the substrate holder, through which the gases are also removed from the process chamber.

A CVD reactor is known from JP 2005072314 in which the gases are fed into the center of a substantially circular process chamber. Here also, the process gases flow through the process chamber in the horizontal direction, but from the inside toward the outside.

U.S. Pat. No. 5,221,556 and JP 2004200225 describe horizontal reactors in which there is flow in a transverse direction over substrate holders driven in rotation, on each of which a substrate lies.

Proceeding from the above-mentioned state of the art, it is an object of the invention to improve the gas flow immediately above the floor of the process chamber.

This object is met by the invention specified in the claims, each claim representing an independent solution to the problem and each claim capable of being combined with any other claim.

The invention is based on the realization that even slight unevennesses on the substrate can lead to local cooling. In addition, minor unevennesses on the floor of the process chamber lead to vortices that can lead to growth inhomogeneities in the further progression of the gas stream.

It is therefore provided first and foremost that the end portion of the gas inlet element projects into a dish-like recess and an end portion of a gas-deflecting surface is aligned with the floor. The dish-like recess is associated with the floor of the process chamber and in particular with the rotationally driven susceptor holder. An end portion of the gas inlet element projects into this dish-like recess. The gas outlet opening for the hydride, which may be arsine, phosphine, or ammonia, extends immediately above this end portion. This outlet opening is rotationally symmetrical. The rotationally symmetrical gas-deflecting surface is to the rear of the outlet opening. The course of the end portion of the gas-deflecting surface merges into the surface of the floor in an aligned manner. Since the gas inlet element is fixed in position relative to the reactor housing, but the susceptor holder rotates relative to the gas inlet element, the gas inlet element is not in touching engagement against the walls of the recess. On the contrary, slits are provided for movement, so that a small gap exists between the planar end face of the gas inlet element and the bottom of the recess. A circumferential gap also exists between the wall of the dish and the end portion of the gas inlet element. This gap is of such small dimensions that it does not interfere in any significant way with the gas flow. The gas-deflecting surface is rounded in the direction of flow of the gas. The gas enters the curved region from the flow channel that extends in the vertical direction and is deflected in the curved region in a vortex-free manner into a horizontal direction. The effective cross-section of the flow channel is thereby enlarged in such a way a reduction in the speed of flow occurs. Nevertheless, the entire flow is however a laminar flow. Above this first gas outlet opening, a wall of which is aligned with the floor of the process chamber, there is at least one further second gas outlet opening for a second process gas, for example a metal-organic constituent. This second gas outlet opening is connected to a second flow channel. The gas outlet element is preferably made from stainless steel and is fluid-cooled. For this, the gas outlet element may have a central region that has a cooling-fluid channel. This cooling-fluid channel extends right into the end portion of the gas inlet element that is located in the recess in the floor of the process chamber.

In a development of the invention, which is of independent character, the gas inlet element has a substantially cylindrical contour. When the process chamber is opened, the gas inlet element is removed from the floor of the process chamber. A process chamber cover is fixedly but releasably connected to the gas inlet element. The process chamber cover has a central opening, by which it can be put over the gas inlet element. The process chamber cover is held on the gas inlet element by a bayonet fitting. For this, the gas inlet element may have radially outwardly protruding projections, which correspond with matching recesses in the central opening of the process chamber cover. If these recesses are lined up with the projections, the process chamber cover may be displaced over the projections. If the process chamber cover is then subsequently rotated slightly, the edge of the central opening rests on the projections.

Figure 2:
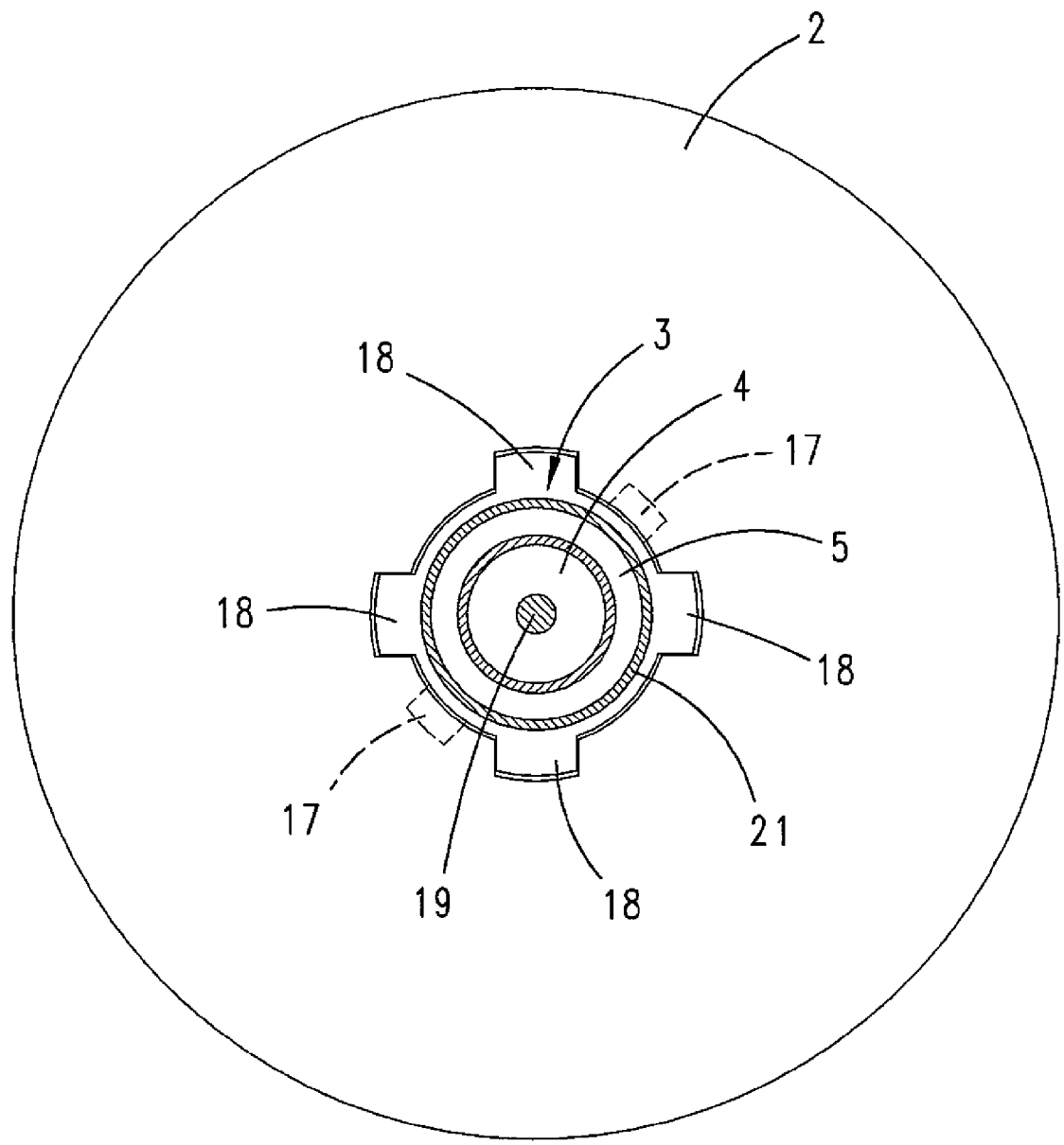

Exemplary embodiments of the invention are explained below on the basis of accompanying drawings, in which:

FIG. 1 shows, very schematically, a half-section in the vertical direction through a process chamber, FIG. 2 shows a plan view of the process chamber top with gas inlet member in section, and FIG. 3 shows a further exemplary embodiment of the invention in an illustration corresponding to FIG. 1.

The exemplary embodiment is an MOCVD reactor. This has a reactor housing, not illustrated in the drawings, which consists for example of stainless steel and is closed in a gas-tight manner against the ambient atmosphere. The process gases and the carrier gases are fed into this reactor housing by way of suitable gas lines. Metal-organic compounds of the third or second main group of the periodic system are used as process gases. In addition, compounds of the fifth main group of the periodic system and in particular hydrides are used as process gases. Compounds of the sixth main group also come into consideration. In addition, the reactor has a gas outlet element, which is also not illustrated in the drawing.

The process chamber 1 outlined in half-section in the drawing is inside the reactor housing. This has a floor 8' extending in the horizontal plane. A process chamber top 2 is provided opposite to and at a spacing from the floor 8'. The process chamber top 2 and the floor 8' are configured to be substantially rotationally symmetrical. A gas inlet element projects into the process chamber through a central opening in the process chamber top 2. The floor 8' has a dish-like recess 23 underneath the opening in the top plate 2. The end portion of the gas inlet element 3 projects into this recess in such a way that only a small gap 10 for movement remains between the end face 3' of the gas inlet element 3 and the bottom of the recess 23. A gap 22 for movement extends in an annular manner around the end portion of the gas inlet element 3 that is located in the recess 23. This annular gap 22 is delimited toward the outside by the wall of the dish.

The annular gap 22 is shown greatly exaggerated in the drawings. This is solely for clarity. In principle, this movement gap 22 should be formed to be as narrow as possible.

While the gas inlet element is associated with the reactor housing in a rotationally fixed manner, the floor 8' of the process chamber 1 is driven in rotation during the coating process. A drive shaft 14 disposed in the center serves for this purpose. The floor 8' is formed substantially by a susceptor holder 8, which may consist of graphite and is heatable from below by means of an RF heater. The construction of the floor 8' corresponds substantially to the construction that is described in DE 10153463 A1, reference being made in this regard to this specification.

The susceptor holder 8 has an annular disk shape. This rotational member has a multiplicity of pockets on its upper side, which is directed toward the process chamber 1, susceptors 9 lying in the pockets. The susceptors 9 have a circular disk shape and lie on a dynamic gas layer. The nozzles generating the gas layer are aligned so that they not only form a rotating layer for the susceptors 9, but also drive the susceptors 9 in rotation. A substrate to be coated lies on each susceptor 9.

The bottom of the recess 23 is formed in the exemplary embodiment by a tension plate 11, which is connected in a rotationally fixed manner to a tension member. A pressure plate 12 is underneath the tension plate 11. The susceptor holder 8 is received between the tension plate 11 and the pressure plate 12. Axial securing of the pressure plate 12 is effected by means of a securing member 13.

The top plate 2 is secured fixedly to the gas inlet element 3. The securing is effected by a bayonet connection. For this, supporting projections 17 that project radially outward are disposed on the outer wall 21 of the gas inlet element. The central opening in the top plate has recesses 18 at corresponding positions, so that it may be raised from below over the supporting projections 17. After the top plate 2 has been rotated a little, it can be supported on the supporting projections 17. The top plate 2 is therefore easily removable.

A plurality of flow channels 4 and 5, in the exemplary embodiment, are inside the gas inlet element. The flow channels 4 and 5 are arranged coaxially with one another. The gas inlet element provides for this a central element 19, which has a cooling water channel 24 on the inside, the channel extending into the end portion of the gas inlet element 3.

The outer surface of the central element 19 runs curved in the axial direction in its end region. This is accompanied by a continuous increase in the diameter of the central element 19, which reaches the diameter of the gas inlet element 3 in the end portion of the gas inlet element 3. As a result of this contour, as seen in cross-section, a gas-deflecting surface 6 is formed, which diverts the gas flow from a vertical direction into a horizontal direction. The deflecting surface 6 originates from the inner wall of the flow channel 4 in a continuous manner, free of bends and steps, and extends in such a way that its end portion 6' runs in a horizontal direction and is aligned with the floor 8' of the process chamber 1.

The outlet opening 4' of the flow channel 4 that extends on a cylindrical lateral surface has a significantly greater area than the cross-sectional area of the flow channel 4, so that the laminar flow through the flow channel 4 changes into a laminar flow of reduced speed over the floor 8'. A second outlet opening 5' is located above the outlet opening 4'.

This outlet opening 5' is also on a cylindrical lateral surface. The outer wall of the first flow channel 4 is formed by a tubular intermediate element 20 of the gas inlet element. The inner wall of the second flow channel 5 is formed by the outer wall of this intermediate element 4, which also forms a gas-deflecting surface 7 in its end region that diverts the flow through the second flow channel 5 by 90°. This gas-deflecting surface 7 is also smooth-walled. The outer wall of the second flow channel 5 is formed by the outer element 21, which also carries the supporting projections 17.

The end face 3' of the gas inlet element 3 is colder than the bottom of the recess 23 underlying it, on account of the coolant channel 24 located immediately above it. The gas exiting from the flow channel 4 is very quickly brought to the process temperature. Both the intermediate element 20 and the outer element 21 may be fluid-cooled. The coolant channels needed for this are not illustrated on account of the schematic nature of the illustration.

The reactor housing is closed by a cover. This cover may be opened. The gas inlet element 3 is suspended on the cover. If the cover is opened, the cover plate 2 and the gas inlet element 3 are removed from the floor 8', so that the susceptors 9 may be loaded with substrates or substrates may be unloaded from them. During this movement, the end portion of the gas inlet element 3 moves out of the recess 23. When the cover of the reactor is closed again, the end portion of the gas inlet element 3 again enters into the recess 23 and floats there above the bottom of the recess 23 and at a spacing from the circular wall of the recess 23.

Swirl mixers are located in the flow channels 4 and 5 and are designated by the reference numerals 26. These swirl mixers form a pressure barrier for the gas entering the flow channels 4, 5. By means of a special gas guide, not illustrated, in the upper, colder portion of the gas inlet element 3, these swirl mixers ensure that the gas flows uniformly through the lower portions of the flow channels 4, 5 in a radial direction, in order to flow out from the openings 5', 4' uniformly and homogeneously in a circumferential direction.

Not only the central portion 19 of the gas inlet element 3 may be cooled. It is also provided that the intermediate element 20 is cooled. For this, a cooling chamber 25 is provided in FIG. 1, through which a cooling fluid flows.

The further exemplary embodiment shown in FIG. 3 has a total of three outlet openings 4', 5', which are arranged one above the other in the vertical direction. As for the first exemplary embodiment, the associated flow channels 4, 5 have swirl mixers 26, in order to homogenize the gas distribution in the circumferential region of the outlet openings 4', 5'. The additional gas outlet opening 5' and the additional flow channel 5 are formed by an additional intermediate element 20.

Here also, the process chamber cover 2 is provided with a central opening, the diameter of which is greater than the diameter of the gas inlet element 3, so that the opening of the process chamber cover 2 can be put over the free end of the gas inlet element 3 when the susceptor holder 8 has been lowered.

All features disclosed are (in themselves) pertinent to the invention. The disclosure content of the associated/accompanying priority documents (copy of the prior application) is also hereby incorporated in full into the disclosure of the application, including for the purpose of incorporating features of these documents in claims of the present application.

The invention claimed is:

1. Apparatus for depositing at least one layer on a substrate by means of a process gas, which is introduced into a rotationally symmetrical process chamber (1) that extends in a horizontal direction through a first flow channel (4) of a gas inlet element (3), the first flow channel extending in a vertical direction and the gas inlet element being fixed in position on a reactor housing, the process gas exiting from a gas outlet opening of a portion of the gas inlet element (3) that projects into a center of the process chamber (1) and flowing in a radially outward direction over a floor (8') of the process chamber (1), the floor extending in a horizontal direction and rotating about the center of the process chamber, and the substrate lying on the floor, the apparatus characterized in that an end (3') of the gas inlet element (3) projects into a dish-like recess (23) in the floor (8') and an end portion (6') of a gas-deflecting surface (6) of the gas inlet (3) is aligned with the floor (8').

2. Apparatus according to claim 1, further characterized in that the gas-deflecting surface is rounded and merges into a wall of the first flow channel (4) in a bend-free and step-free manner.

3. Apparatus according to claim 1, further characterized in that the floor (8') is formed by a susceptor holder (8) that is driven in rotation.

4. Apparatus according to claim 3, further characterized in that the susceptor holder (8) carries a plurality of susceptors (9) for receiving one or more substrates, the susceptors being driven in rotation.

5. Apparatus according to claim 1, further characterized by at least one further second gas outlet opening of a second flow channel, disposed above the outlet opening of the first flow channel (4).

6. Apparatus according to claim 1, further characterized in that the gas inlet element (3) consists of steel.

7. Apparatus according to claim 5, further characterized in that the flow channels inside the gas inlet element (3) are arranged concentrically, at least near a region of the gas outlet openings.

8. Apparatus according to claim 1, further characterized in that the gas inlet element (3) is a carrier for a process chamber cover (2) and in particular has a diameter that is less than a diameter of an opening in the process chamber cover (2), so that the process chamber cover can be put over a portion of the gas inlet element (3) that projects into the process chamber (1).

9. Apparatus according to claim 8, further characterized in that the process chamber cover (2) is secured to the gas inlet element (3) by a bayonet fitting.

10. Apparatus according to claim 1, further characterized in that the gas inlet element (3) is fluid-cooled.

11. Apparatus according to claim 1, further characterized in that a channel (24) for a fluid coolant extends into the end of the gas inlet element (3) that projects into the recess (23).

* * * * *

UNITED STATES PATENT AND TRADEMARK OFFICE
CERTIFICATE OF CORRECTION

Page 1 of 1

PATENT NO. : 8,152,924 B2
APPLICATION NO. : 12/094972
DATED : April 10, 2012
INVENTOR(S) : Martin Dauelsberg, Johannes Käppeler and Conor Martin It is certified that error appears in the above-identified patent and that said Letters Patent is hereby corrected as shown below:

On the title page item:

(22) PCT Filed

"Nov. 11, 2006"

should be

--Nov. 21, 2006--

Signed and Sealed this
Twenty-ninth Day of May, 2012

David J. Kappos
*Director of the United States Patent and Trademark Office*